(12) United States Patent
Wu (10) Patent No.: US 8,890,160 B2
(45) Date of Patent: Nov. 18, 2014

(54) AMOLED DISPLAY AND MANUFACTURING METHOD THEREOF

(71) Applicant: Shenzhen China Star Optoelectronics Technology Co., Ltd., Guangdong (CN)

(72) Inventor: Yuanchun Wu, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 13/985,954

(22) PCT Filed: Feb. 26, 2013

(86) PCT No.: PCT/CN2013/071901
§ 371 (c)(1),
(2), (4) Date: Aug. 16, 2013

(87) PCT Pub. No.: WO2014/127546
PCT Pub. Date: Aug. 28, 2014

(65) Prior Publication Data
US 2014/0246653 A1    Sep. 4, 2014

(51) Int. Cl.
*H01L 29/04* (2006.01)
*H01L 27/32* (2006.01)

(52) U.S. Cl.
CPC .................................. *H01L 27/326* (2013.01)
USPC .................... 257/59; 257/72; 257/40; 438/34

(58) Field of Classification Search
CPC .. H01L 27/124; H01L 27/1251; H01L 27/127
USPC .................................... 257/59, 72, 40; 438/34
See application file for complete search history.

(56) References Cited

U.S. PATENT DOCUMENTS

| | | | |
|---|---|---|---|
| 2008/0116457 A1* | 5/2008 | Park et al. | 257/59 |
| 2009/0315451 A1 | 12/2009 | Choi et al. | |
| 2009/0321725 A1 | 12/2009 | Yoshida et al. | |
| 2010/0271349 A1* | 10/2010 | Liu et al. | 345/205 |

FOREIGN PATENT DOCUMENTS

| | | |
|---|---|---|
| CN | 101681931A A | 3/2010 |
| CN | 101958339A A | 1/2011 |

* cited by examiner

*Primary Examiner* — Tu-Tu Ho
(74) *Attorney, Agent, or Firm* — Andrew C. Cheng (57) ABSTRACT

An AMOLED display and a manufacturing method are proposed. The AMOLED display includes a substrate, a first TFT disposed on the substrate, and a second TFT disposed on the substrate. The first TFT includes a first gate disposed on the substrate, a first active layer disposed on the first gate, and a first source/drain disposed on the first active layer. The second TFT includes a second active layer which is in the same layer as the first active layer is, a second gate disposed on the second active layer, and a second source/drain disposed on the second active layer. The AMOLED display and the manufacturing method thereof proposed by the present invention effectively increase AMOLED resolution owing to a newly added metallic layer which separates the first gate from the second gate. Compared with the conventional technology, the present invention includes fewer manufacturing processes, which can greatly reduce production costs.

11 Claims, 9 Drawing Sheets

AMOLED DISPLAY AND MANUFACTURING METHOD THEREOF

BACKGROUND OF THE INVENTION

1. Field of the Invention

The present invention relates to a flat panel display, and more particularly, to an active matrix organic light emitting diode (AMOLED) display and a manufacturing method thereof.

2. Description of the Prior Art

An organic light emitting diode display (OLED) is also called an organic light emitting diode. The OLED is one of the latest technologies rising in the middle of the twentieth century. Compared with a liquid-crystal display (LCD), the OLED has merits of all-solid-state, active illumination, high brightness, high contrast, thinness, lost costs, low power consumption, fast response, wide viewing angle, wide range of working temperature, easily flexible display, and so on. The OLED basically comprises a substrate, an anode, a cathode, and an organic functional layer. The light-emitting principle of the OLED is that positive and negative carriers are injected into an organic semiconductor thin-film and are conjugated through a plurality of very thin and laminated layers of organic material between the anode and the cathode for generating light. The organic functional layer of the OLED comprises three functional layers, that is, a hole transport layer (HTL), an emissive layer (EML), and an electron transport layer (ETL). Each of the functional layers can comprise one or more than one layer. For example, the HTL can sometimes be divided into a hole injection layer and a hole transport layer. The hole injection layer and the hole transport layer have similar functions, so they are generally called the HTL layer. The ETL can be divided into an electron transport layer and an electron injection layer. The electron transport layer and the electron injection layer have similar functions, so they are generally called the ETL layer.

Nowadays, the manufacturing method of a full-color OLED comprises three types: using three separate RGB OLEDs which emit red, blue, and green color, using a white OLED to emit white color incorporation with RGB color filters, and color conversion. The type of using three separate RGB OLEDs is the most potential of all because it is most frequently used in real applications. The manufacturing method of the type of using three separate RGB OLEDs is that using different lighting materials to manufacture the RGB OLEDs.

The OLED is divided into a passive driving and an active driving. In other words, the OLED is divided into direct addressing and addressing in a TFT matrix. The active driving OLED is an active matrix/organic light emitting diode (AMOLED), which is also called active matrix organic light emitting diode (AMOLED).

Figure 1:
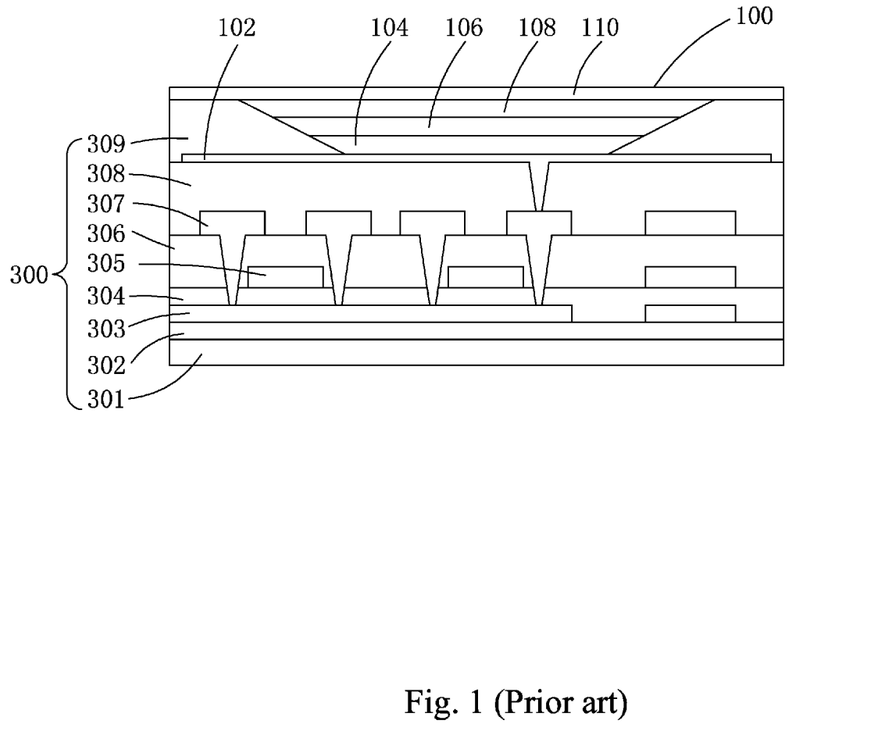
FIG. 1 shows a structure diagram of a conventional AMOLED.

Please refer to FIG. 1. The conventional AMOLED comprises an OLED 100 and a TFT (thin-film transistor) 300 electrically connected to the OLED 100. The manufacturing method for the conventional AMOLED comprises following steps: forming the TFT 300 of which a pixel electrode serves as an anode 102 of the OLED 100, forming a hole transport layer (HTL) 104 on the anode 102, forming an emissive layer (EML) 106 on the HTL layer 104, forming an electron transport layer (ETL) 108 on the EML 106, and forming a cathode 110 on the ETL 108.

The conventional TFT 300 is produced after undergoing seven to ten photomask processes. The formation of the conventional TFT 300 is that a first insulation layer 302 is formed on the substrate 301; an active layer 303 is formed on the first insulation layer 302; a predetermined pattern is marked on the active layer 303 through a photomask process; a second insulation layer 304 is formed on the active layer 303; a first metallic layer is formed on the second insulation layer 304; a gate 305 is formed on the first metallic layer through a photomask process; a third insulation layer 306 is formed on the first metallic layer; a second metallic layer is formed on the third insulation layer 306; a source/drain 307 is formed on the second metallic layer through a photomask process; a fourth insulation layer 308 is formed on the second metallic layer; a pixel electrode (anode) 102 is formed on the fourth insulation layer 308; a fifth insulation layer 309 is formed on the pixel electrode 102; a predetermined pattern is marked on the fifth insulation layer 309 through a photomask process. Finally, the TFT 300 is produced.

Figure 2:
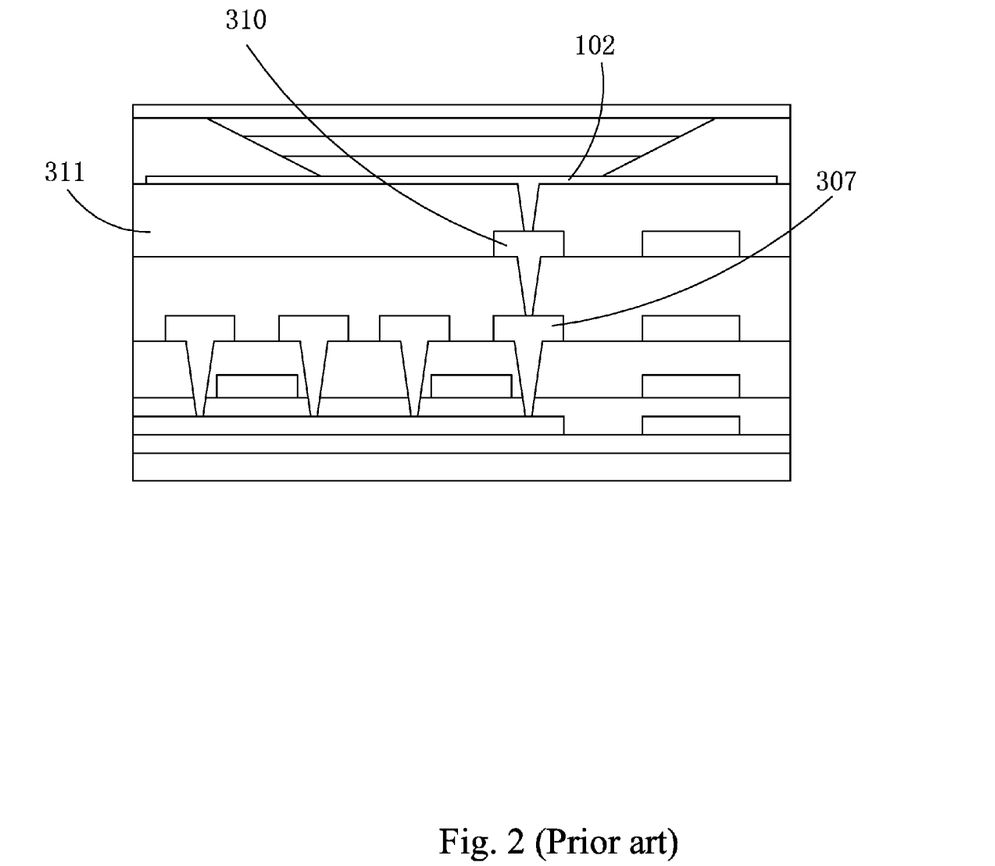
FIG. 2 shows a structure diagram of a conventional AMOLED with high resolution.

With the increase in the resolution (high ppi), space for designing the pixel becomes inadequate. To compensate for the fault, a third metallic layer 310 (as shown in FIG. 2) is added on the fourth insulation layer 308 in the conventional TFT 300. A sixth insulation layer 311 is formed on the third metallic layer 310. One terminal of the third metallic layer 310 is electrically connected to the anode 102 of the OLED 100, and the other terminal of the third metallic layer 310 is electrically connected to the source/drain 307 of the conventional TFT 300 for facilitating conduction of the conventional TFT 300 and conduction of the OLED 100. In this way, more pixels can be designed.

However, two photomask processes have to be added in this method, which complicates the manufacturing process of the TFT and increases production costs greatly.

SUMMARY OF THE INVENTION

An object of the present invention is to provide an AMOLED display which has features of simple structure, high resolution, and low production costs.

Another object of the present invention is to provide a manufacturing method for the AMOLED display. Features of the manufacturing method for the AMOLED display are that the manufacturing processes of the AMOLED display are simple, costs are low, and the resolution of a produced AMOLED display can be increased effectively.

According to the present invention, an active matrix organic light emitting diode (AMOLED) display, comprises: a substrate, a first TFT (thin-film transistor) disposed on the substrate, and a second TFT disposed on the substrate, the first TFT comprising a first gate disposed on the substrate, a first active layer disposed on the first gate, and a first source/drain disposed on the first active layer, the second TFT comprising a second active layer which is in the same layer as the first active layer is, a second gate disposed on the second active layer, and a second source/drain disposed on the second active layer.

Furthermore, a first gate insulation layer is disposed between the first gate and the first active layer and between the first gate and the second active layer, a second gate insulation layer is disposed between the second gate and the first active layer and between the second gate and the second active layer, and a first interlayer dielectric layer is disposed on the second gate insulation layer.

Furthermore, the first gate is at least partially overlapped with the first active layer, and the second gate is at least partially overlapped with the second active layer.

Furthermore, the substrate comprises a plurality of pixels, and the first TFT and the second TFT are disposed on each of the plurality of pixels.

Furthermore, the AMOLED display also comprises a storage capacitor and an organic light emitting component, the storage capacitor and the organic light emitting component are disposed in each of the plurality of pixels, the storage capacitor is disposed on the substrate, and the organic light emitting component comprises a first electrode disposed on the second TFT and electrically connected to the second TFT, an organic light emitting layer disposed on the first electrode, and a second electrode disposed on the organic light emitting layer.

Furthermore, the first TFT is a switch TFT, the second TFT is a driver TFT, and the second TFT is electrically connected to the first TFT.

Furthermore, the first active layer comprises a polysilicon layer and the second active layer comprises a polysilicon layer.

According to the present invention, an active matrix organic light emitting diode (AMOLED) display, comprises: a substrate, a first TFT (thin-film transistor) disposed on the substrate, and a second TFT disposed on the substrate, the first TFT comprising a first gate disposed on the substrate, a first active layer disposed on the first gate, and a first source/drain disposed on the first active layer, the second TFT comprising a second active layer which is in the same layer as the first active layer is, a second gate disposed on the second active layer, and a second source/drain disposed on the second active layer, wherein a first gate insulation layer is disposed between the first gate and the first active layer and between the first gate and the second active layer, a second gate insulation layer is disposed between the second gate and the first active layer and between the second gate and the second active layer, and a first interlayer dielectric layer is disposed on the second gate insulation layer, wherein the first gate is at least partially overlapped with the first active layer, and the second gate is at least partially overlapped with the second active layer, wherein the substrate comprises a plurality of pixels, and the first TFT and the second TFT are disposed on each of the plurality of pixels, wherein the AMOLED display also comprises a storage capacitor and an organic light emitting component, the storage capacitor and the organic light emitting component are disposed in each of the plurality of pixels, the storage capacitor is disposed on the substrate, and the organic light emitting component comprises a first electrode disposed on the second TFT and electrically connected to the second TFT, an organic light emitting layer disposed on the first electrode, and a second electrode disposed on the organic light emitting layer, wherein the first TFT is a switch TFT, the second TFT is a driver TFT, and the second TFT is electrically connected to the first TFT, wherein the first active layer comprises a polysilicon layer and the second active layer comprises a polysilicon layer.

According to the present invention, a manufacturing method for an AMOLED display, comprises following steps of:

Step 1: Providing a substrate and defining a first TFT zone and a second TFT zone on the substrate;

Step 2: Forming a first metallic layer on the substrate and patterning the first metallic layer for forming a first gate on the first TFT zone;

Step 3: Forming a first gate insulation layer on the first gate and the substrate;

Step 4: Forming an active zone layer on the first gate insulation layer and patterning the active zone layer for forming a first active layer on the first TFT zone and forming a second active layer on the second TFT zone;

Step 5: Forming a second gate insulation layer on the first active layer and the second active layer;

Step 6: Forming a second metallic layer on the second gate insulation layer and patterning the second metallic layer for forming a second gate on the second TFT zone;

Step 7: Forming a first interlayer dielectric layer on the second gate and the second gate insulation layer, and patterning the first interlayer dielectric layer;

Step 8: Forming a third metallic layer on the first interlayer dielectric layer and patterning the third metallic layer for forming a first source/drain on the first TFT zone and forming a second source/drain on the second TFT zone.

Furthermore, the manufacturing method for the AMOLED display further comprises:

Step 9: Forming a second interlayer dielectric layer on the first source/drain and the second source/drain and patterning the second interlayer dielectric layer through a photomask process;

Step 10: Forming a transparent conducting layer on the second interlayer dielectric layer and forming a first electrode through the photomask process;

Step 11: Forming a third interlayer dielectric layer on a first electrode and patterning the third interlayer dielectric layer through the photomask process;

Step 12: Forming an organic light emitting layer on the third interlayer dielectric layer;

Step 13: Forming a second electrode on the organic light emitting layer.

Furthermore, a first active layer and a second active layer undergo processes of laser anneal and doping in the fourth step.

The beneficial effects of the present invention are that the AMOLED display and the manufacturing method thereof proposed by the present invention effectively increase AMOLED resolution owing to a newly added metallic layer which separates a first gate from a second gate. Compared with the conventional technology, the present invention comprises fewer manufacturing processes, which can greatly reduce production costs.

These and other objectives of the claimed invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification.

DETAILED DESCRIPTION OF THE PREFERRED EMBODIMENTS

The drawings illustrate embodiments of the invention and, together with the description, serve to explain the principles of the invention.

Figure 3:
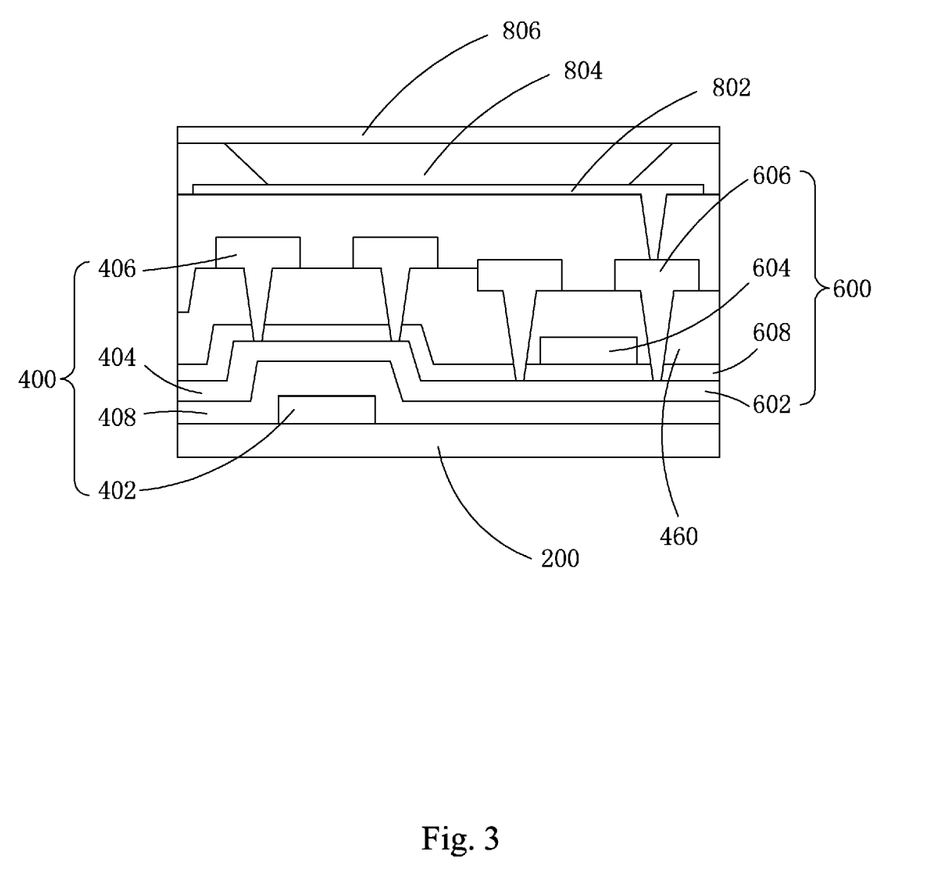
FIG. 3 shows an AMOLED display according to one embodiment of the present invention.
Figure 4:
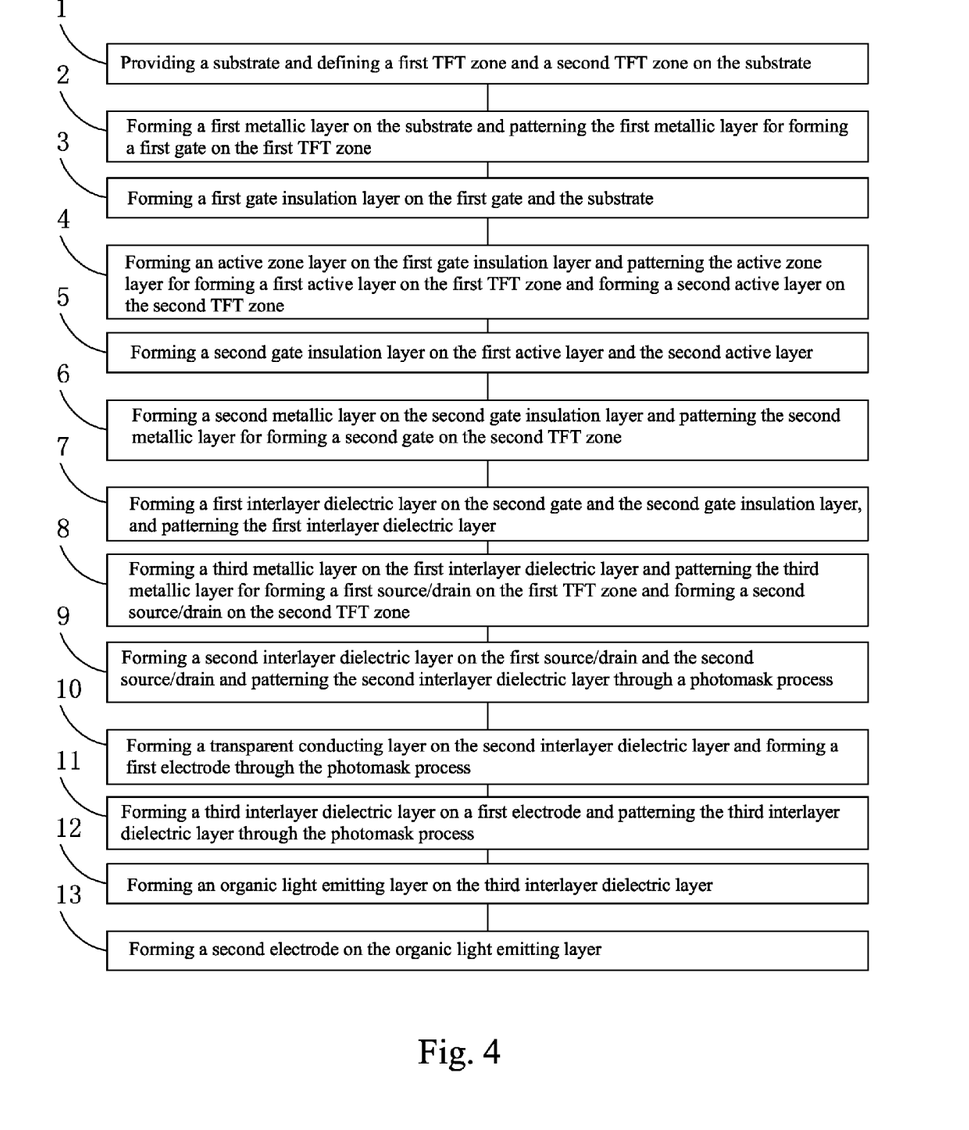
FIG. 4 is a flowchart of a manufacturing method for the AMOLED display.

Refer to FIG. 3 showing an AMOLED display according to one embodiment of the present invention. The AMOLED display comprises a substrate 200, a first TFT 400 disposed on the substrate 200, and a second TFT 600 disposed on the substrate 200. A plurality of pixels (not shown) are disposed on the substrate 200. The first TFT 400 and the second TFT 600 are disposed on each of the plurality of pixels. The first TFT 400 is a switch TFT. The second TFT 600 is a driver TFT. The second TFT 600 is electrically connected to the first TFT 400.

The first TFT 400 comprises a first gate 402 disposed on the substrate 200, a first active layer 404 disposed on the first gate 402, and a first source/drain 406 disposed on the first active layer 404. The first gate 402 is at least partially overlapped with the first active layer 404.

The second TFT 600 comprises a second active layer 602 which is in the same layer as the first active layer 404 is, a second gate 604 disposed on the second active layer 602, and a second source/drain 606 disposed on the second active layer 602. The second gate 604 is at least partially overlapped with the second active layer 602.

A first gate insulation layer 408 is disposed between the first gate 402 and the first active layer 404 and between the first gate 402 and the second active layer 602. A second gate insulation layer 608 is disposed between the second gate 604 and the first active layer 404 and between the second gate 604 and the second active layer 602. A first interlayer dielectric (ILD) layer 460 is disposed on the second gate insulation layer 608.

The substrate 200 is either a glass substrate or a plastic substrate in this embodiment. Preferably, the substrate 200 is a glass substrate. The first and second gates 402 and 604 and the first and second sources/drains 406 and 606 all comprise a Mo layer, an Al layer, a Ti layer, or a Cu layer. Or, the first and second gates 402 and 604 and the first and second sources/drains 406 and 606 comprise the lamination of Mo, Al, Ti, and Cu layers. The first and second gates 402 and 604 and the first and second sources/drains 406 and 606 are all formed after undergoing deposition, yellow light, etching processes, or other photomask processes. The deposition is sputtering basically. The first gate insulation layer 408 and the second gate insulation layer 608 are SiNx layers in general and are formed through chemical vapor deposition (CVD). The first interlayer dielectric layer 460 is either a SiNx layer or a SiOx layer. Or the first interlayer dielectric layer 460 is the lamination of the SiNx and SiOx layers. The first active layer 404 and the second active layer 602 are polysilicon layers which are formed after a-Si material undergoes processes of laser anneal and doping. Preferably, the first active layer 404 and the second active layer 602 are low temperature poly-silicon (LTPS) layers.

The AMOLED display also comprises a storage capacitor (not shown) disposed on a pixel and an organic light emitting component 800 disposed on a pixel. The storage capacitor is disposed on the substrate 200. The organic light emitting component 800 comprises a first electrode 802 disposed on the second TFT 600 and electrically connected to the second TFT 600, an organic light emitting layer 804 disposed on the first electrode 802, and a second electrode 806 disposed on the organic light emitting layer 804.

Figure 5:
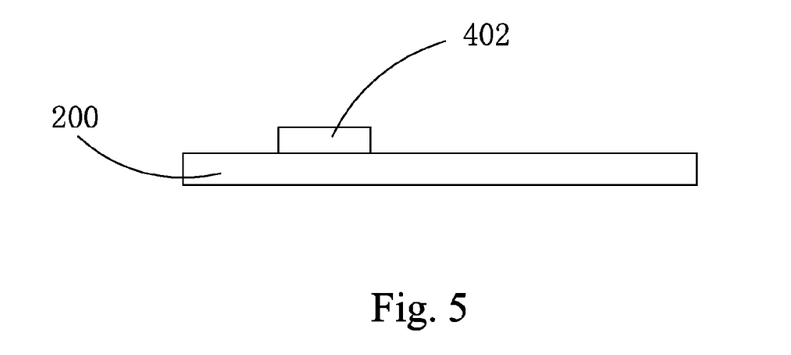
FIGS. 5 to 16 show structures of the AMOLED display in each step of the manufacturing method illustrated in FIG. 4.

Please refer to FIGS. 4 to 16. A manufacturing method for the AMOLED display is also proposed by the present invention. The manufacturing method for the AMOLED display comprises steps as follows:

Step 1: Provide a substrate 200, and define a first TFT zone and a second TFT zone on the substrate 200.

Figure 6:
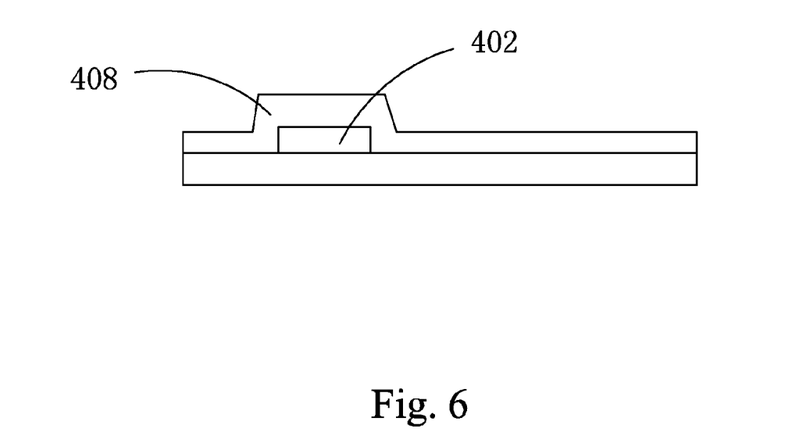

Step 2: Form a first metallic layer on the substrate 200, and pattern the first metallic layer for forming a first gate 402 on the first TFT zone.

The substrate 200 is a glass substrate (preferably) or a plastic substrate. The first metallic layer is a Mo layer, an Al layer, a Ti layer, or a Cu layer. Or the first metallic layer is the lamination of Mo, Al, Ti, and Cu layers. The first metallic layer is formed on the substrate 200 through sputtering.

The photomask process comprises exposure, development, and etching. Practical operations of the photomask process comprises that a layer of photo-sensitive material covers the first metallic layer. The layer of photo-sensitive material is a so-called photoresist layer. Afterwards, light beams illuminate the photoresist layer through grayscale mask or semi-grayscale mask to expose the photoresist layer. Since both of the grayscale mask and the semi-grayscale mask comprise a pattern of an active region, some light beams can use the grayscale mask or the semi-grayscale mask to illuminate the photoresist layer. Thus, the exposure of the photoresist layer is selective. Meanwhile, the patterns of the grayscale mask and the semi-grayscale mask are completely duplicated on the photoresist layer. Subsequently, part of the photoresist layer is removed with a proper developer and then the photoresist layer shows a required pattern. Next, part of the first metallic layer is removed using an etching process. Wet etching, dry etching, or both is used in the etching process. Finally, the remaining patterned photoresist layer is completely removed. At this stage, the first gate 402 with a predetermined pattern is formed.

Figure 7:
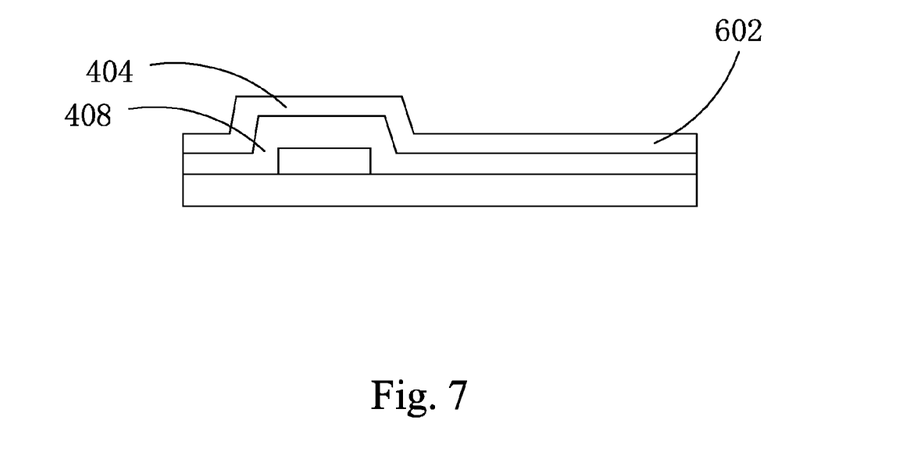

Step 3: Form a first gate insulation layer 408 on the first gate 402 and the substrate 200.

The first gate insulation layer 408 is a SiNx layer. The first gate insulation layer 408 is deposited on the first gate 402 and the substrate 200 through chemical vapor deposition (CVD).

Figure 8:
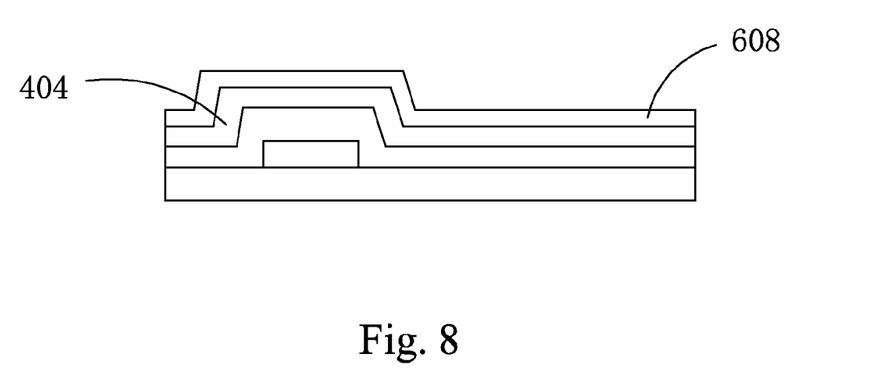

Step 4: Form an active zone layer on the first gate insulation layer 408, and pattern the active zone layer for forming a first active layer 404 on the first TFT zone and for forming a second active layer 602 on the second TFT zone.

The first active layer 404 and the second active layer 602 are polysilicon layers which are formed after a-Si material undergoes processes of laser anneal and doping. Preferably, the first active layer 404 and the second active layer 602 are low temperature poly-silicon (LTPS) layers.

Figure 9:
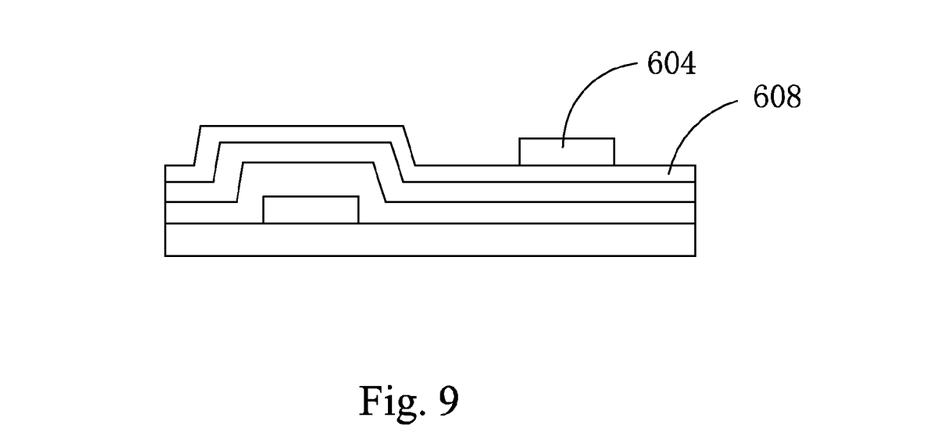

Step 5: Form a second gate insulation layer 608 on the first active layer 404 and the second active layer 602.

The second gate insulation layer 608 can also be a SiNx layer. The second gate insulation layer 608 is deposited on the first active layer 404 and the second active layer 602 through CVD.

Figure 10:
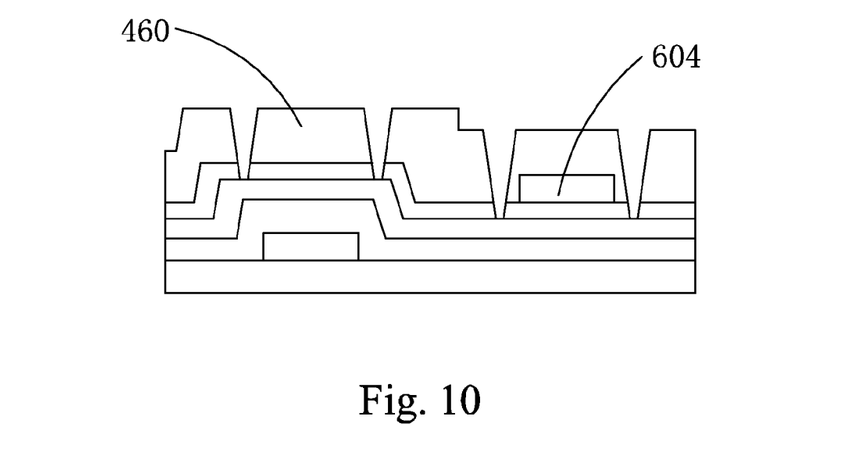

Step 6: Form a second metallic layer on the second gate insulation layer 608, and pattern the second metallic layer for forming a second gate 604 on the second TFT zone.

The second metallic layer is a Mo layer, an Al layer, a Ti layer, or a Cu layer. Or the second metallic layer is the lamination of Mo, Al, Ti, and Cu layers. The second metallic layer is formed on the second gate insulation layer 608 through the sputtering in general.

Figure 11:
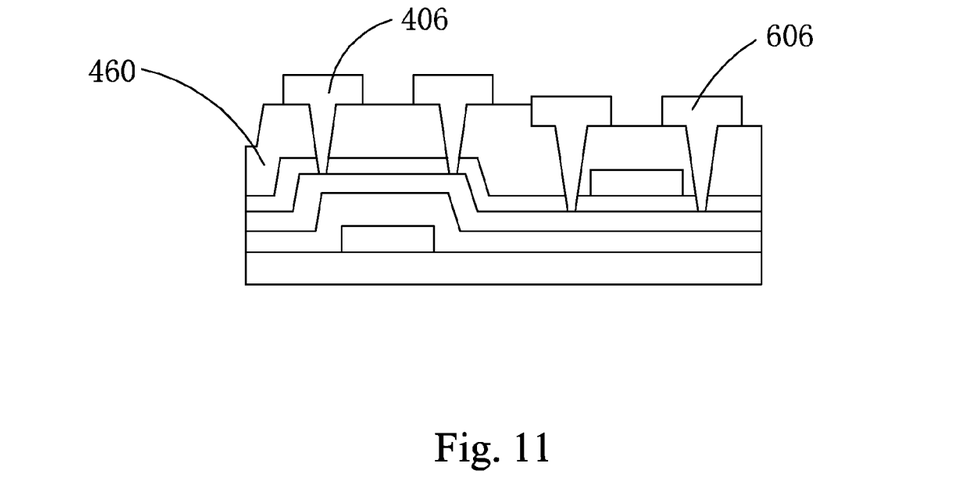

Step 7: Form a first interlayer dielectric layer 460 on the second gate 604 and the second gate insulation layer 608, and pattern the first interlayer dielectric layer 460.

The first interlayer dielectric layer 460 is either a SiNx layer or a SiOx layer. Or the first interlayer dielectric layer 460 is the lamination of SiNx and SiOx layers.

Figure 12:
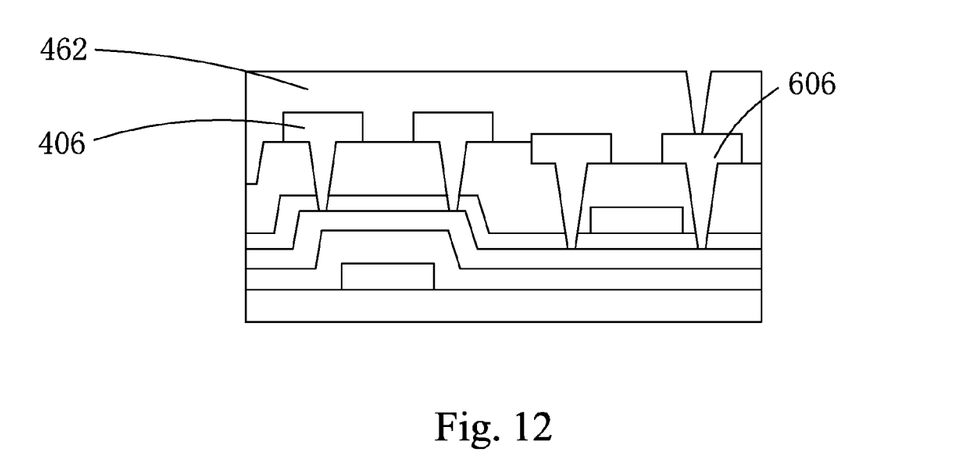

Step 8: Form a third metallic layer on the first interlayer dielectric layer 460, and pattern the third metallic layer for forming a first source/drain 406 on the first TFT zone and for forming a second source/drain 606 on the second TFT zone.

The third metallic layer is a Mo layer, an Al layer, a Ti layer, or a Cu layer. Or the third metallic layer is the lamination of Mo, Al, Ti, and Cu layers. The third metallic layer is formed on the first interlayer dielectric layer 460 through the sputtering in general.

Figure 13:
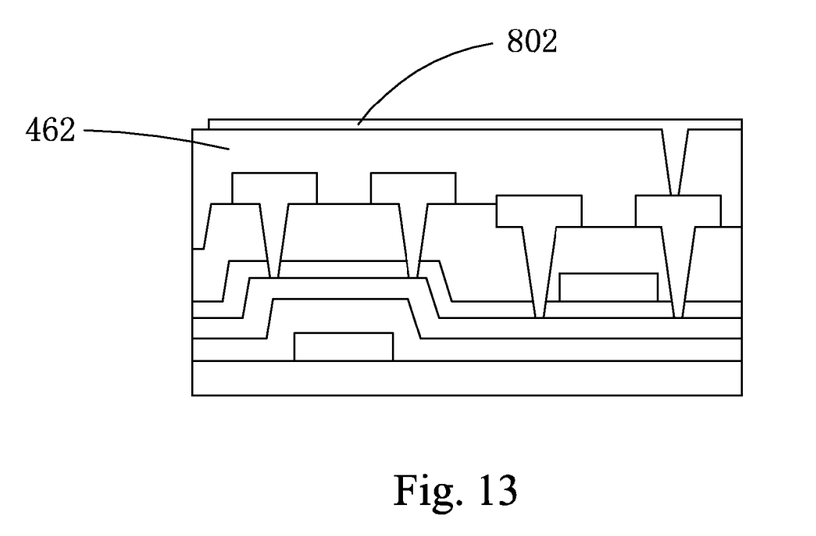

Step 9: Form a second interlayer dielectric layer 462 on the first source/drain 406 and the second source/drain 606, and pattern the second interlayer dielectric layer 462 through the photomask process.

The second interlayer dielectric layer 462 is either a SiNx layer or a SiOx layer. Or the second interlayer dielectric layer 462 is the lamination of SiNx and SiOx layers.

Figure 14:
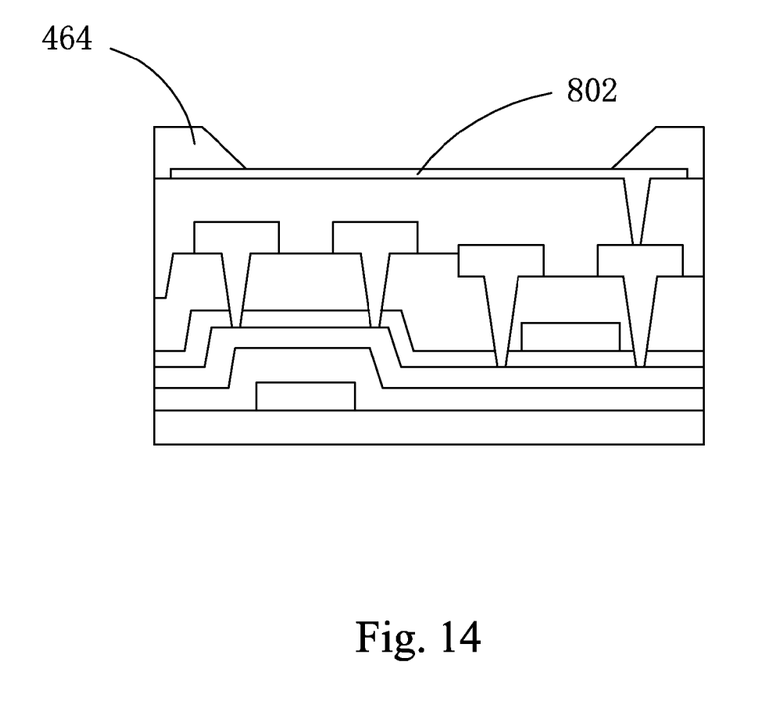

Step 10: Form a transparent conducting layer on the second interlayer dielectric layer 462, and form a first electrode 802 through the photomask process.

The transparent conducting layer is an indium tin oxide (ITO) layer, an indium zinc oxide (IZO) layer, an aluminum zinc oxide (AZO) layer, or a Ga-doped ZnO (GZO) layer. Or the transparent conducting layer is the lamination of ITO, IZO, AZO and GZO layers.

Figure 15:
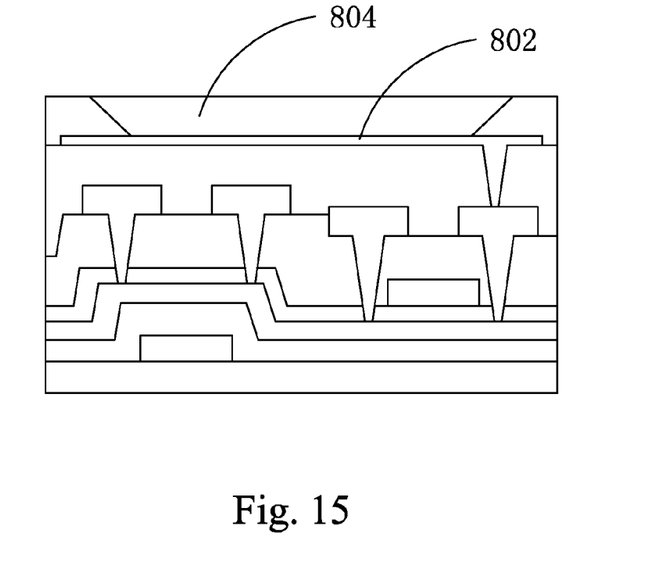

Step 11: Form a third interlayer dielectric layer 464 on the first electrode 802 and pattern the third interlayer dielectric layer 464 through the photomask process.

The third interlayer dielectric layer 464 is either a SiNx layer or a SiOx layer. Or the third interlayer dielectric layer 464 is the lamination of SiNx and SiOx layers.

Figure 16:
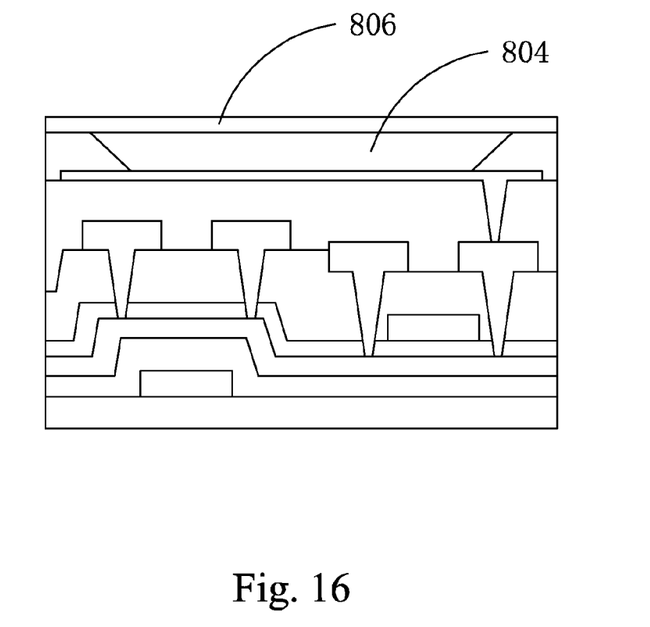

Step 12: Form an organic light emitting layer 804 on the third interlayer dielectric layer 464.

Step 13: Form a second electrode 806 on the organic light emitting layer 804.

To sum up, the AMOLED display and the manufacturing method thereof proposed by the present invention effectively increase AMOLED resolution owing to a newly added metallic layer which separates the first gate from the second gate. Compared with the conventional technology, the present invention comprises fewer manufacturing processes, which can greatly reduce production costs.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. An active matrix organic light emitting diode (AMOLED) display, comprising: a substrate, a first TFT (thin-film transistor) disposed on the substrate, and a second TFT disposed on the substrate, the first TFT comprising a first gate disposed on the substrate, a first active layer disposed on the first gate, and a first source/drain disposed on the first active layer, the second TFT comprising a second active layer which is in the same layer as the first active layer is and connects the first active layer, a second gate disposed on the second active layer, and a second source/drain disposed on the second active layer.

2. The AMOLED display as claimed in claim 1, wherein a first gate insulation layer is disposed between the first gate and the first active layer and between the first gate and the second active layer, a second gate insulation layer is disposed between the second gate and the first active layer and between the second gate and the second active layer, and a first interlayer dielectric layer is disposed on the second gate insulation layer.

3. The AMOLED display as claimed in claim 2, wherein the first gate is at least partially overlapped with the first active layer, and the second gate is at least partially overlapped with the second active layer.

4. The AMOLED display as claimed in claim 1, wherein the substrate comprises a plurality of pixels, and the first TFT and the second TFT are disposed on each of the plurality of pixels.

5. The AMOLED display as claimed in claim 4, wherein the AMOLED display also comprises a storage capacitor and an organic light emitting component, the storage capacitor and the organic light emitting component are disposed in each of the plurality of pixels, the storage capacitor is disposed on the substrate, and the organic light emitting component comprises a first electrode disposed on the second TFT and electrically connected to the second TFT, an organic light emitting layer disposed on the first electrode, and a second electrode disposed on the organic light emitting layer.

6. The AMOLED display as claimed in claim 5, wherein the first TFT is a switch TFT, the second TFT is a driver TFT, and the second TFT is electrically connected to the first TFT.

7. The AMOLED display as claimed in claim 5, wherein the first active layer comprises a polysilicon layer and the second active layer comprises a polysilicon layer.

8. An active matrix organic light emitting diode (AMOLED) display, comprising: a substrate, a first TFT (thin-film transistor) disposed on the substrate, and a second TFT disposed on the substrate, the first TFT comprising a first gate disposed on the substrate, a first active layer disposed on the first gate, and a first source/drain disposed on the first active layer, the second TFT comprising a second active layer which is in the same layer as the first active layer is and connects the first active layer, a second gate disposed on the second active layer, and a second source/drain disposed on the second active layer, wherein a first gate insulation layer is disposed between the first gate and the first active layer and between the first gate and the second active layer, a second gate insulation layer is disposed between the second gate and the first active layer and between the second gate and the second active layer, and a first interlayer dielectric layer is disposed on the second gate insulation layer, wherein the first gate is at least partially overlapped with the first active layer, and the second gate is at least partially overlapped with the second active layer, wherein the substrate comprises a plurality of pixels, and the first TFT and the second TFT are disposed on each of the plurality of pixels, wherein the AMOLED display also comprises a storage capacitor and an organic light emitting component, the storage capacitor and the organic light emitting component are disposed in each of the plurality of pixels, the storage capacitor is disposed on the substrate, and the organic light emitting component comprises a first electrode disposed on the second TFT and electrically connected to the second TFT, an organic light emitting layer disposed on the first electrode, and a second electrode disposed on the organic light emitting layer, wherein the first TFT is a switch TFT, the second TFT is a driver TFT, and the second TFT is electrically connected to the first TFT, wherein the first active layer comprises a polysilicon layer and the second active layer comprises a polysilicon layer.

9. A manufacturing method for an AMOLED display, comprising following steps of:
Step 1: Providing a substrate and defining a first TFT zone and a second TFT zone on the substrate;
Step 2: Forming a first metallic layer on the substrate and patterning the first metallic layer for forming a first gate on the first TFT zone;
Step 3: Forming a first gate insulation layer on the first gate and the substrate;
Step 4: Forming an active zone layer on the first gate insulation layer and patterning the active zone layer for forming a first active layer on the first TFT zone and forming a second active layer on the second TFT zone, wherein the second active layer connects the first active layer;
Step 5: Forming a second gate insulation layer on the first active layer and the second active layer;
Step 6: Forming a second metallic layer on the second gate insulation layer and patterning the second metallic layer for forming a second gate on the second TFT zone;
Step 7: Forming a first interlayer dielectric layer on the second gate and the second gate insulation layer, and patterning the first interlayer dielectric layer;
Step 8: Forming a third metallic layer on the first interlayer dielectric layer and patterning the third metallic layer for forming a first source/drain on the first TFT zone and forming a second source/drain on the second TFT zone.

10. The manufacturing method for the AMOLED display as claimed in claim 9, wherein the manufacturing method for the AMOLED display further comprises:
Step 9: Forming a second interlayer dielectric layer on the first source/drain and the second source/drain and patterning the second interlayer dielectric layer through a photomask process;
Step 10: Forming a transparent conducting layer on the second interlayer dielectric layer and forming a first electrode through the photomask process;
Step 11: Forming a third interlayer dielectric layer on a first electrode and patterning the third interlayer dielectric layer through the photomask process;
Step 12: Forming an organic light emitting layer on the third interlayer dielectric layer;
Step 13: Forming a second electrode on the organic light emitting layer.

11. The manufacturing method for the AMOLED display as claimed in claim 9, wherein a first active layer and a second active layer undergo processes of laser anneal and doping in the fourth step.

* * * * *